United States Patent
Bordes

(10) Patent No.: US 7,565,279 B2
(45) Date of Patent: Jul. 21, 2009

(54) CALLBACKS IN ASYNCHRONOUS OR PARALLEL EXECUTION OF A PHYSICS SIMULATION

(75) Inventor: Jean Pierre Bordes, St. Charles, MO (US)

(73) Assignee: NVIDIA Corporation, Santa Clara, CA (US)

( * ) Notice: Subject to any disclaimer, the term of this patent is extended or adjusted under 35 U.S.C. 154(b) by 476 days.

(21) Appl. No.: 11/213,339

(22) Filed: Aug. 29, 2005

(65) Prior Publication Data

US 2006/0200331 A1 Sep. 7, 2006

Related U.S. Application Data

(60) Provisional application No. 60/658,602, filed on Mar. 7, 2005.

(51) Int. Cl.
G06G 7/62 (2006.01)
G06F 9/44 (2006.01)
G06F 3/00 (2006.01)
G06F 9/46 (2006.01)
G06F 13/00 (2006.01)

(52) U.S. Cl. .................. 703/17; 717/135; 719/312; 719/318

(58) Field of Classification Search .............. 703/17; 717/135
See application file for complete search history.

(56) References Cited

U.S. PATENT DOCUMENTS

| | | | |
|---|---|---|---|
| 5,664,162 A | 9/1997 | Dye | |
| 5,721,834 A | 2/1998 | Milhaupt et al. | |
| 5,812,147 A | 9/1998 | Van Hook et al. | |
| 5,841,444 A | 11/1998 | Mun et al. | |
| 5,938,530 A | 8/1999 | Watanabe | |
| 5,966,528 A | 10/1999 | Wilkinson et al. | |
| 6,058,465 A | 5/2000 | Nguyen | |
| 6,425,822 B1 | 7/2002 | Hayashida et al. | |
| 6,466,898 B1* | 10/2002 | Chan | 703/17 |
| 6,570,571 B1 | 5/2003 | Morozumi | |
| 6,823,518 B1* | 11/2004 | Bliss et al. | 719/310 |
| 6,966,837 B1 | 11/2005 | Best | |
| 7,120,653 B2* | 10/2006 | Alfieri et al. | 707/204 |
| 2003/0117397 A1* | 6/2003 | Hubrecht et al. | 345/420 |
| 2003/0225560 A1* | 12/2003 | Garcia et al. | 703/17 |
| 2004/0075623 A1 | 4/2004 | Hartman | |
| 2005/0041031 A1 | 2/2005 | Diard | |
| 2005/0075154 A1 | 4/2005 | Bordes et al. | |

(Continued)

OTHER PUBLICATIONS

Xiaotong Zhuang, Santosh Pande, "Balancing Register Allocation Across Threads for a Multithreaded Network Processor" PLDI'04, Jun. 9-11, 2004, Washington DC, USA. pp. 289-300.*

(Continued)

*Primary Examiner*—Paul L Rodriguez
*Assistant Examiner*—Dwin M Craig
(74) *Attorney, Agent, or Firm*—Patterson & Sheridan, LLP

(57) ABSTRACT

Embodiments of a callback procedure mechanism and method are disclosed in relation to a system running a physics simulation in parallel with a main application. A main application registers callback procedures in memory shared with the physics simulation in response to data generated by the physics simulation. The callback procedures are executed by the physics simulation with data generated by the physics simulation.

39 Claims, 5 Drawing Sheets

U.S. PATENT DOCUMENTS

| | | |
|---|---|---|
| 2005/0075849 A1 | 4/2005 | Maher et al. |
| 2005/0086040 A1 | 4/2005 | Davis et al. |
| 2005/0223383 A1* | 10/2005 | Tetrick .................. 718/104 |
| 2005/0251644 A1 | 11/2005 | Maher et al. |
| 2006/0129371 A1* | 6/2006 | Orofino et al. ............ 703/22 |
| 2006/0155552 A1* | 7/2006 | Chen et al. ................. 705/1 |

OTHER PUBLICATIONS

O. Coulaud, M. Dussere, A. Esnard, "Toward a Distributed Computational Steering Environment based on Corba" Future Generation Computing Systems, 1999, pp. 1-6 and a citation page.*

* cited by examiner

CALLBACKS IN ASYNCHRONOUS OR PARALLEL EXECUTION OF A PHYSICS SIMULATION

This application claims the benefit of U.S. Provisional Application Ser. No. 60/658,602 filed Mar. 7, 2005 and entitled "Method Providing Callbacks in an Asynchronous or Parallel Physics Simulation, the subject matter of which is hereby incorporated by reference.

BACKGROUND OF THE INVENTION

The present invention relates generally to systems running a physics simulation within the context of a main application. In one embodiment, the present invention relates to systems, such as Personal Computers (PCs) and game consoles, comprising a physics co-processor, or a so-called Physics Processing Unit (PPU). Several exemplary embodiments of a PPU-enabled system are disclosed in U.S. patent application Ser. No. 10/715,370 filed Nov. 19, 2003 and Ser. No. 10/839,155 filed May 6, 2004.

In response to the growing appetite for physics-based animations, software-based physics engines have conventionally been added to, or associated with the program code implementing a main application. Indeed, a market currently exists for "physics middleware"—specialty software directed to the generation and incorporation of physics-based data within a main application. Companies like HAVOK and MathEngine have developed this type of specialty software that may be called by a main application to better incorporate natural looking, physics-based animations into the main application.

Conventional software-based physics engines allow programmers increased latitude to assign virtual mass and coefficients of friction to objects animated within the execution of the main application. Similarly, virtual forces, impulses, and torques may be applied to objects. In effect, software-based physics engines provide programmers with a library of procedures to simplify the visual creation of scenes having physics-based interaction between objects.

Unfortunately, as has been previously documented, the growing appetite for animated realism can not be met by merely providing additional specialty software into a single execution thread, thereby layering upon the CPU additional processing requirements. And this is true regardless of the relative sophistication of the specialty software.

In the discussion that follows, the term "physics engine" describes a range of software and/or hardware products adapted to provide a main application with the ability to simulate various kinds of physical or physics-based properties and/or effects, such as rigid-body simulation, fluid simulation, and/or cloth simulation to name just a few examples. Conventional, physics middleware is one type of physics engine. As currently implemented, conventional physics middleware establishes a software library adapted to run on the same processor as a main application in a single processor system.

However, systems having multiple processors, multiple execution threads, and/or multiple cores are becoming increasingly common. Additionally, special purpose add-on processors or subsystems, such as the PPU referenced above are also becoming commercially available. Thus, a physics engine implemented within the context of one of these systems will be a very different in its nature from physics engines conventionally implemented using physics middleware.

For example, one or more of the additional processors, cores, execution threads, or a separately provided PPU may be used to run the physics simulation and thus implement a physics engine. This is particularly true where significant additional processing power is required to execute a simulation comprising larger, more complex scenes including a greater numbers of actors having more detailed geometry.

However implemented, physics engines are typically associated with an Application Programming Interface (API) through which at least a main application may communicate with the physics engine. The physics engine API may be provided as part of the main application, as part of an Operating System (OS) associated with one or more computational platforms, and/or within the physics simulation code. By making calls to procedures identified in the physics engine API, the main application may configure a simulation, configure physics data (e.g., static data, parameters, and/or state information) for the simulation, advance the simulation in time (i.e., cause the physics engine to compute the state of the simulation at a next step in time), and/or query various state information, such as position and applied forces to actors in the simulation, etc. Calls to procedures identified in the physics engine API, among many other possible calls, are typically initiated by the main application.

The term "call" as variously used to broadly describes any interaction by which one piece of software causes the initiation, execution, retrieval, storage, indexing, update, etc., of another piece of software, or the execution of another piece of software using resources associated with a computational platform, typically including firmware and/or hardware. The term "run" describes any process in which hardware resources associated with a computational platform perform an operation under the direction (directly or indirectly) of a software resource.

Frequently, a main application may wish (or require) notification related to a particular event occurring in a simulation. For example, a specific physics data value to-be-derived by the simulation code running on the physics engine may be required by the main application in order to initiate a particular procedure. An "event" may be defined in terms of physics data (or other data) generation and/or availability, one or more simulation actor(s) characteristic(s) and/or interaction(s), an execution and/or temporal point in the simulation or main application, a user input, etc. While it is certainly possible for the main application to repeatedly query the physics engine after each simulation time step in relation to the event of interest, many physics engines such as conventional physics middleware, provide a more efficient callback registration mechanism.

Consider the example shown in FIG. 1. In this example, a main application 1 calls a physics engine 2 through an associated physics engine API 3 in relation to a particular callback procedure associated with one or more events. In this regard, main application 1 is said to "register the callback." There are many possible ways to register a callback are known to those skilled in the art, but one example will serve for the current description.

In order to register a callback, main application 1 identifies a callback procedure 5 associated with the event of interest and calls physics engine 2 through physics engine API 3. Callback procedure 5 is typically part of the main application code block but may also be separately provided. Assuming the use of a programming language such as C or C++, callback procedure 5 may be registered with physics engine 2 by communicating a procedure pointer value (e.g., an address vector) identifying the location of callback procedure 5 in a memory associated with the main application. This procedure pointer value may be stored in any reasonable memory or register 7 accessible by physics engine 2.

Events are known to and able to be identified by simulation 6. Thus, when a possible event of interest occurs during execution of simulation 6, or has occurred during a given simulation time step, callback register 7 is queried to determine whether a corresponding callback procedure has been registered. Where a corresponding callback procedure is found, simulation code 6 calls callback procedure 5 using information provided by the callback procedure registration. With data (e.g., physics data) provided by physics engine 2, callback procedure 5 is able to run, and the main application is accordingly able to progress.

This type of callback mechanism works well, so long as the main application and simulation are running in the single execution thread. This is true regardless of the type of computational platform (e.g., processor, core, PPU, etc.) actually executing the thread. However, in a system running a simulation in parallel with, or asynchronously to, a main application thread, a more sophisticated callback mechanism is required. In other words, parallel (whether wholly or in part) execution of application and simulation threads has the potential to create serious problems with callback procedures. As the simulation proceeds on one execution thread, the main application proceeds on another execution thread. Thus, a callback procedure registration that potentially looks forward to a future occurring event, must account for the possibility that the main application and/or the simulation may be in an indeterminate state relative to the information state assumed by the callback registration when the event finally occurs.

Clearly, parallel/asynchronous execution of a main application and simulation requires greater sophistication in the definition and execution of a related callback procedure.

SUMMARY OF THE INVENTION

Embodiments of the invention address the foregoing issues among others. One embodiment provides a method of implementing a callback procedure in a system. The method comprises executing one or more application thread(s) related to a main application, and executing one or more simulation thread(s) in parallel with the application thread. By operation of the application thread, a callback procedure is registered, and by operation of the simulation thread the callback procedure is called.

In one aspect, the system comprises first and second computational platforms and an optionally provided shared memory accessible by the first and second computational platforms. In such embodiments, the method further comprises executing the application thread on the first computational platform, executing the simulation thread on the second computational platform, and executing the callback procedure on either the first or second computational platform. Additionally, but optionally, the method further comprises generating callback results by operation of the simulation thread, writing the callback results to the shared memory, where it is present, and thereafter by operation of the main application reading the results from shared memory.

Within the various embodiments, the callback procedure may be one related to collision or contact editing, procedural force calculation, custom constraint calculation, a dynamic material property, a sleep/wake mode, a custom shape intersection, or a custom Axis Aligned Bounding Box (AABB) calculation.

In yet another aspect, the system may include an event queue receiving event data derived from execution of the simulation thread. In embodiments having an event queue, the method may further comprises transferring event data from the event queue to a memory accessible by one or both of the computational platforms.

Another embodiment of the invention provides a method of transferring event data in a system comprising an event queue. The method comprises; by operation of a main application, calling a polling procedure, by operation of the polling procedure, determining whether event data is available in the event queue, and by operation of the main application, calling a read event queue procedure to read event data in the event queue.

Yet another embodiment of the invention provides a method of executing a callback procedure in a system. The method comprises; executing an application thread on a first computational platform, executing a simulation thread on a second computational platform, during execution of the application thread, registering a callback procedure by transferring data comprising an embedded code related to the callback procedure from the first computational platform to the second computational platform.

In a related aspect, the callback procedure takes the form of an embedded code procedure that is executed using a local temporary memory associated with the second computational platform to derive callback data. The embedded code may comprise source code or object code, for example, source code written in assembly language or a higher level language, or object code written in terms of a native instruction set or a virtual machine instruction set related to the second computational platform.

In still another embodiment, the invention provides a system comprising; a first computational platform executing an application thread and a second computational platform executing a simulation thread in parallel with the application thread, and a callback mechanism adapted to register a callback procedure in response to the application thread and call the callback procedure in response to data derived from the simulation thread.

In still another embodiment, the invention provides a system comprising; a Central Processing Unit (CPU) running a main application, a physics engine running a simulation in parallel with the main application, and a callback mechanism adapted to enable the main application to register a callback procedure with the physics engine.

The physics engine may be a processor or a Physics Processing Unit (PPU). The CPU may be a first processor core in a multi-core processor and the physics engine comprises a second processor core in the multi-core processor.

BRIEF DESCRIPTION OF THE DRAWINGS

The drawings, taken together with the foregoing discussion, the detailed description that follows, and the claims, describe several embodiments of the invention. The drawings include the following:

DESCRIPTION OF EXEMPLARY EMBODIMENTS

Figure 1:
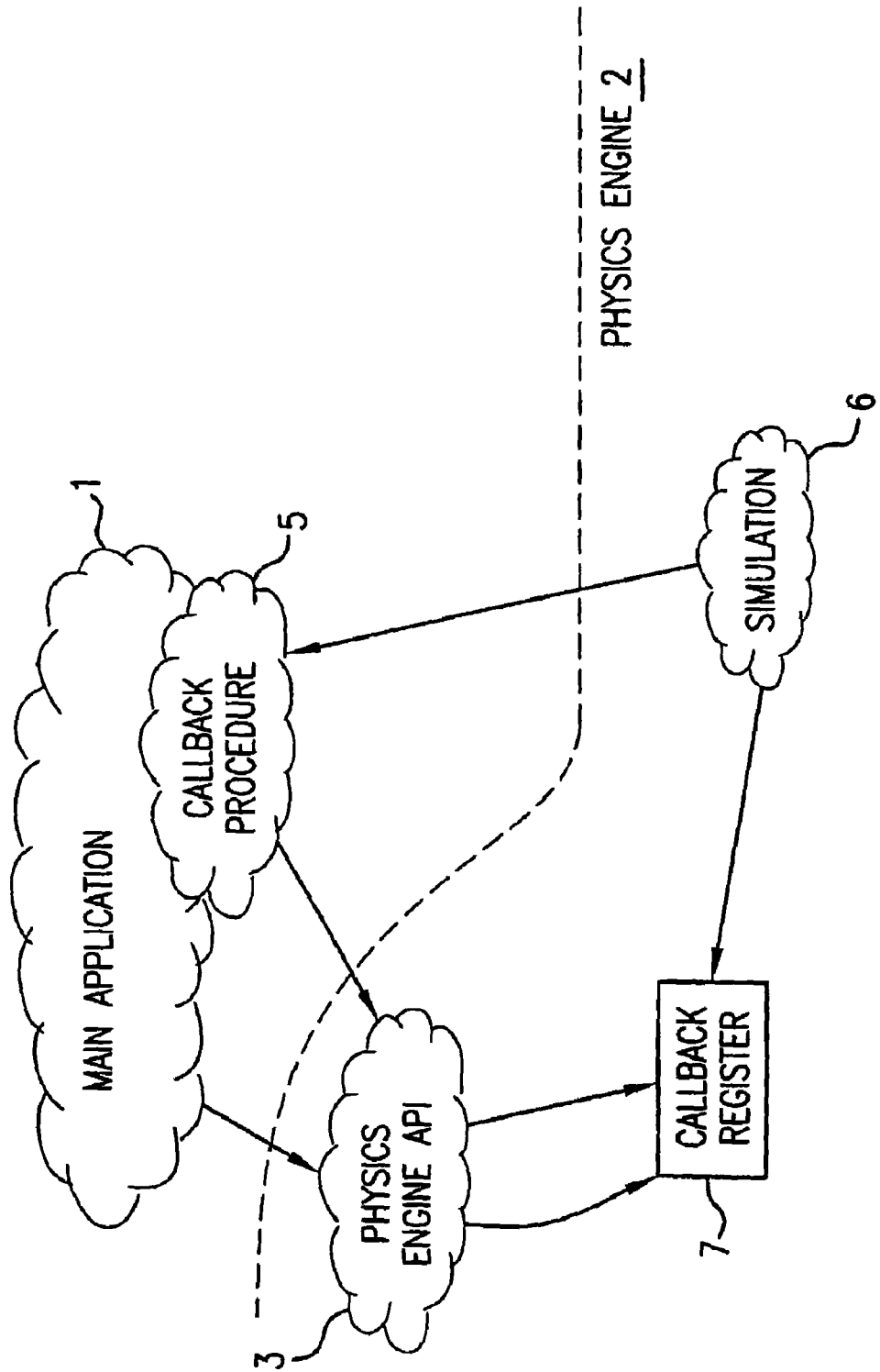
FIG. 1 is a conceptual diagram illustrating a conventional callback mechanism run on a system executing a main application and simulation on a single thread.

This application is related to U.S. patent application Ser. No. 10/982,791 filed Nov. 8, 2004; Ser. No. 10/982,764 also filed Nov. 8, 2004; Ser. No. 10/9715,459 filed Nov. 19, 2003; and, Ser. No. 10/839,155 filed May 6, 2004. The subject matter of these four (4) commonly assigned patent applications is hereby incorporated by reference.

The invention recognizes that conventional single execution thread solutions to the incorporation of physics data from physics simulations have limits that affect their practical implementation. That is, emerging applications, such as PC and console games, would benefit considerably from the inclusion of greater quantities of physics data. This reality implicates more sophisticated simulations running in real time with a main application. However, the real-time implementation of more sophisticated simulations requires at least some degree of parallel execution between the simulation and main application. Recognizing this reality, embodiments of the invention address the reoccurring necessity of administering callbacks between a simulation and main application running in parallel.

Before proceeding with a description of exemplary embodiments, several related concepts are described. As foreshadowed in the foregoing applications incorporated by reference and the background discussion, embodiments of the invention may find application in many different system types implementing a physics simulation.

One preferred type of system includes a PPU separately provided to a host system in order to execute software implementing the simulation. Such systems present readily apparent boundaries between separate computational platforms. That is, the host system CPU controls a first computational platform comprising resources primarily apparent in the host system while the PPU controls a second computational platform comprising resources primarily apparent on a PCI or PCI Express card, for example, and associated with the PPU subsystem. Thus, a first execution thread associated with the main application is run on the CPU-based first computational platform, while a second execution thread associated with the simulation is run on the PPU-based second computational platform.

However, the resource boundaries between different computational platforms in other system types aren't quite as readily apparent. For example, multiple processors provided in a system or multiple processing cores provided by a single processor may access data from one or more common memories in order to execute multiple threads, including for example an application thread and a simulation thread. Thus, various hardware, firmware and/or software configurations may be used to form (temporarily or permanently) distinct computational platform(s) within various system types. However configured, each computational platform is preferably adapted to implement, at least over some finite time period, one or more execution threads within the context of the invention.

The term "execution thread" broadly refers to any coherent set of instructions acting upon data. The term "application thread" refers to any execution thread running software, wholly or in part, associated with the main application. The term "simulation thread" refers to any execution thread running software, wholly or in part, associated with the simulation.

The general nature and broad allowable construction of the term "computational platform" notwithstanding, one embodiment of the invention certainly contemplates a system comprising a separately provided PPU. The PPU envisioned and taught in various embodiments of the above incorporated applications is specially configured to efficiently execute physics simulations, and to rapidly transfer, store, and compute physics data. Given current processor capabilities and architectures, a second CPU (or a second processor core) would not execute physics subroutines with nearly the efficiency of the PPU-enabled system embodiment. Nonetheless, use of a second CPU or second core as a PPU is certainly possible. In this regard, the term "PPU" should be read as encompassing not only a single integrated circuit, or chip set logically executing physics subroutines, but also any associated data transfer circuits, memories, registers, buffers, etc. Thus, in many embodiments of the invention, the term "PPU" may be understood as shorthand for a PPU system or subsystem.

Regardless of actual implementation specifics, the present invention is characterized in some embodiments by the asynchronous, parallel operation of separate computational platforms respectively executing threads associated with a main application and simulation. The term "asynchronous" defines any system operating methodology wherein execution of any part of the main application using resources provided by a corresponding computational platform is run in parallel with (1) the execution of algorithms and/or subroutines adapted to determine physics data provided by the second computational platform, (2) second computational platform-based definitions and/or updates to physics data, and/or (3) the transfer or storage of physics data from a memory associated with the second computational platform.

In another aspect, embodiments of the invention seek to maximize the parallel run-time efficiency of the main application and simulation threads on their respective computational platforms. Thus, while it is possible in selected embodiments of the invention for a first computational platform running a main application to wait for physics data being derived on a second computational platform, such waits are either eliminated or greatly reduced over wait times inherent in the conventional systems synchronously executing a main application and simulation. Asynchronous, therefore, describes any execution method capable of any degree of independent operation as between a main application thread and simulation thread. Completely asynchronous operation is not required. In this context, the related terms "asynchronous [ly]" and "in parallel" connote a greatly expanded ability by a first computational platform to execute a main application during time periods where physics data is being calculated and/or manipulated by a second computational platform. The reverse is also true, since the second computational platform is able to execute physics subroutines defining the simulation during time periods where the first computational platform is executing the main application.

Asynchronous operation allows both computational platforms to be fully and efficiently utilized. Proper execution of the main application, even portions of the main application requiring significant quantities of physics data from the simulation, may proceed without extended wait cycles that would otherwise threaten the real-time incorporation of physics data into the main application. That is, while the extensive computational algorithms and subroutines required to generate sophisticated physics data are being run on one computational platform, other subroutines associated with the main application, which do not required physics data (or updated physics data) to proceed, may be run on another computational platform.

However, where physics data is required by the main application in order to proceed, a "callback mechanism" may be used to facilitate the request, tracking, transfer, and/or use of physic data between a main application and a simulation. The term "callback mechanism" in this context refers to any combination of software and/or hardware resources capable of such facilitation. One or more callback mechanisms may be provided within a system, and each callback mechanism is typically associated with one or more callback procedures. In similar vein, a "callback procedure" is any piece of software adapted to facilitate the request, tracking, transfer, and/or use of physic data between the main application and simulation. A callback procedure will generally be provided as part of the main application, but might be separately provided as part of an Operating System, an API, or an entirely separate application.

In a great majority of physics simulations, it is desirable to support a number of different callback procedures. A different callback procedure (or a different type of callback procedure) will generally be run in relation to different types of events potentially occurring in a physics simulation. As previously noted, the actual number and nature of possible events are limited by only the imagination of the simulation and/or main application designer. However, several presently contemplated event types are discussed below as teaching examples.

In this regard, many main applications will provide callback procedures related to collisions and/or contacts between actors in the simulation. Corresponding collision callback procedures and/or contact callback procedures generally enable the main application to correspondingly modify data sets associated with collision points and/or contact points between the actors. Collision points and/or contact points are routinely determined, calculated, and/or updated as part of any competent physics simulation. Indeed, calculation of the physics data required to properly update collision and/or contact points for multiple interacting actors (and particularly multiple, complex actors interacting under multiple constraints) is exactly the type of computational heavy lifting a second computational platform (e.g., a PPU) is designed to offload from a first computational platform running the main application. Yet, the main application almost always requires some subset of the updated collision and/or contact point data before proceeding with certain main application-internal procedures. Accordingly, one or more callback procedures allow physics data related to the collision and/or contact points to be provided by the simulation, and ultimately incorporated (either directly or following subsequent processing) into the main application in order to progress execution of the main application.

Other exemplary types of callback procedures include procedures related to a procedural force, custom constraint, dynamic material property, sleep/wake mode, custom shape intersection (i.e., narrow-phase) calculation, and/or custom shape Axis Aligned Bounding Box (AABB) calculation.

Each callback procedure or callback procedure type is generally associated with one or more scene entity types, and/or defined inputs or outputs. Table 1 below summarizes these relationships for the selected examples noted above.

TABLE 1

| Callback Procedure Type | Associated Scene Entity | Callback inputs | Callback outputs |
| --- | --- | --- | --- |
| collision/contact editing | at least one shape | shape geometry data and state information for colliding shapes, and/or contact point data | modified collision and/or contact point data |
| procedural force | an actor | actor state information | external force and/or torque vectors applied to actor |
| custom constraint | two actors | state information for both actors | data representing constraint between actors, needed for computing constraint force |
| dynamic material property | geometry primitives | actor state information | material property data |
| sleep/wakeup | an actor | actor state information | actor sleep or awake state |
| custom shape intersection | at least one shape | shape data and state information for two colliding shapes | collision and/or contact point data |
| custom AABB calculation | a shape | shape data and state information | shape AABB data |

With some understanding of possible event types and corresponding callback procedures, exemplary callback mechanisms will now be described.

Figure 2:
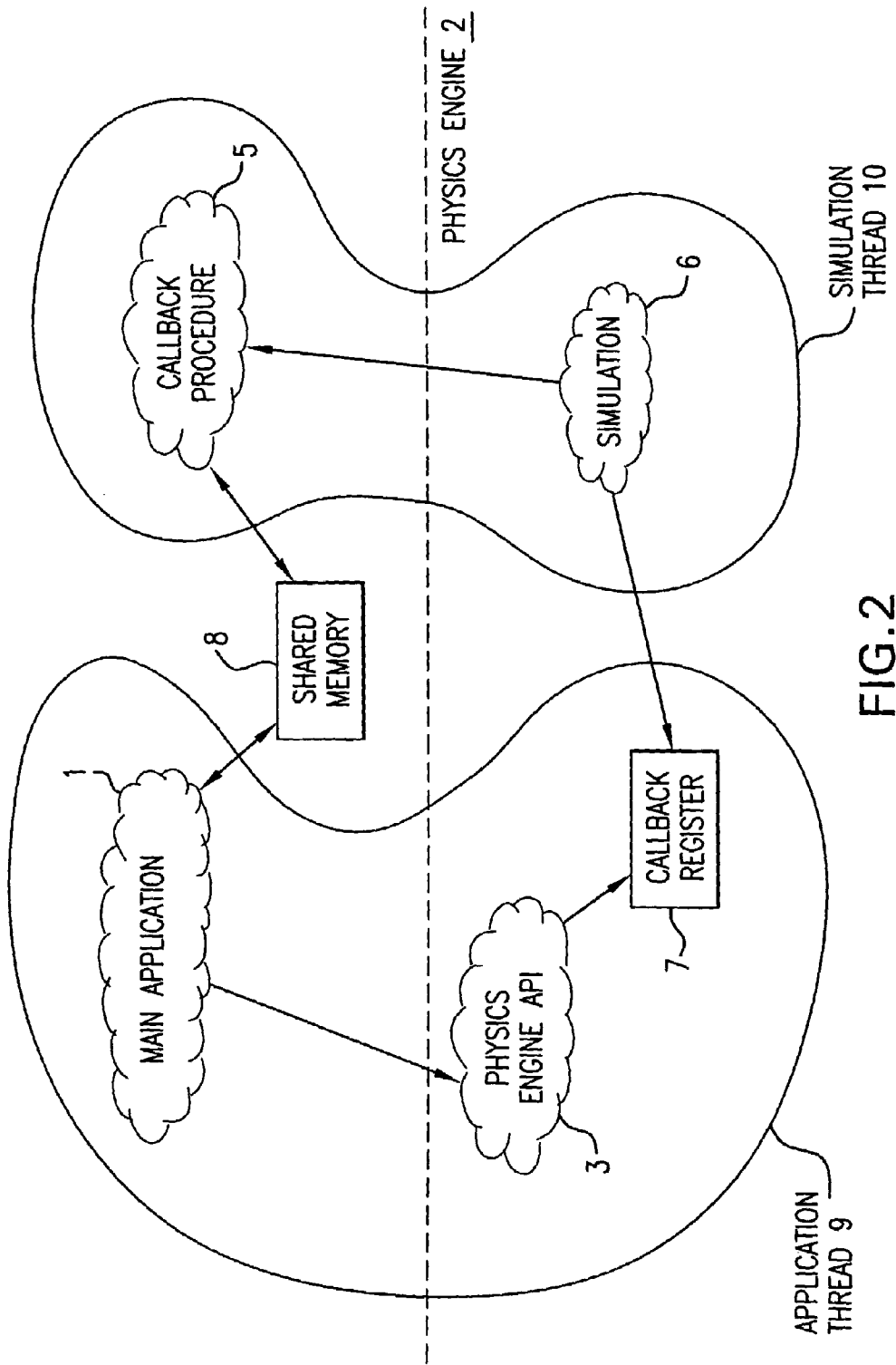
FIG. 2 is a conceptual diagram illustrating one embodiment of a callback mechanism consistent with the invention.

FIG. 2 illustrates one embodiment of a callback mechanism contemplated by the invention. Here, main application 1 and callback procedure 5 both access data from a shared memory 8. Shared memory 8 may be a main memory within a host system, for example. As main application 1 runs, callback procedure 5 is registered with physics engine 2 via physics engine API 3 using any one of numerous callback registration techniques known in the art. For example, a callback procedure pointer value may be stored in callback register 7 associated with physics engine 2. Callback register 7 may take any one of many forms including a dedicated memory device, an identified section or location in a general purpose (e.g., shared) memory device, a dedicated register (or register set), a general register, etc.

Callback procedure 5 is associated with a specific event or event type. A specific event may be related to one or more actors implicated in simulation 6, whereas an event type may be any general event type occurring in relation to any simulation actor. For purposes of this description, individual components within the constellation of potential objects and features capable of being displayed as part of an animation defined, at least in part, by simulation 6 will generally be termed "actors.".

When during its execution, simulation 6 recognizes that an event of possible interest has occurred, it determines whether or not a corresponding callback procedure has been registered in relation to the event. Where a corresponding callback procedure has been registered in callback register 7, for example, physics engine 2 will call the corresponding callback procedure 5. In most instances, but not always, physics engine 2 will also provide physics data derived from simulation 6 in conjunction with the call to callback procedure 5.

With the provision of requested physics data, callback procedure 5 is able to run. Callback procedure 5 may take many different forms and perform many different functions. For example, a basic callback procedure may do little more than facilitate the transfer and storage of physics data received from the computational platform running simulation 6 to a memory location accessible by the computational platform running main application 1. More sophisticated callback procedures may implement an algorithm or subroutines using the physics data as an input and thereafter provide the results to the main application.

For example, note that in the embodiment illustrated in FIG. 2, simulation 6 and callback procedure 5 may be run sequentially on one execution thread—simulation thread 10, while main application 1 runs in parallel on another execution thread—application thread 9. Within the context of this example, application thread 9 may be run on a first computational platform while simulation 6 and/or callback procedure 5 may be run on a second computational platform. Alternatively, callback procedure 5 may be run separately on a third computational platform.

Of further note, callback procedure 5, however executed in relation to a thread or computational platform, will ultimately provide "callback results" to main application 1. Callback results may be physics data and/or data derived from physics data, or some other data derived from an output provided by simulation 6 and/or physics engine 2. In the embodiment shown in FIG. 2, the callback results are stored in shared memory 8 which is accessible by main application 1. As main application 1 runs, at least in part, in parallel with simulation 6 and/or callback procedure 5, the validity of data stored in shared memory 8 must be carefully vetted. Fortunately, many conventional methods may be applied to the problem of data cache or shared memory data integrity (e.g., defined data sandboxes, memory locking, read/write synchronization, etc.).

Several concepts emerge from consideration of the exemplary callback mechanism described in relation to FIG. 2. First, unlike the conventional callback mechanism described in relation to FIG. 1, embodiments of the invention are readily applicable to systems running an application thread in parallel with a simulation thread. Unlike the conventional example, wherein the main application must wait for physics data from the simulation or run the risk of receiving state-erroneous physics data, embodiments of the invention allow a main application thread to proceed without either waiting for physics data or potentially relying on erroneous physics data received from the simulation.

Additionally, the computational and administrative load associated with callback procedures may be exported from a first computational platform running the application thread to a second computational platform running the simulation, or some other execution thread and/or computational platform. Consider, for example, the likelihood that physics data requested by a main application through registration of one or more callback procedures has already been calculated and is currently available because a corresponding simulation is ahead of the main application in its respective execution cycle. In a perfect world, the application thread would be able to immediately access this available physics data and proceed with the main application. In conventional reality, by the time the simulation thread finishes computing the physics data some other function or procedure requires attention from the resources provided by the computational platform executing the application thread. Thus, despite the fact that the main application need not wait for the calculation of physics data, the callback procedure(s) end up waiting until the first computational platform has available computational cycles.

Within the context of embodiments of the invention, this need not be the case. Because the one or more callback procedures are executed in a thread other than the application thread, they may be executed immediately upon availability of the requested physics data. In theory, many hundreds of callback procedures requested by the main application during a single animation frame may be executed on one or more execution threads running in parallel, wholly or in part, with the application thread.

Figure 3:
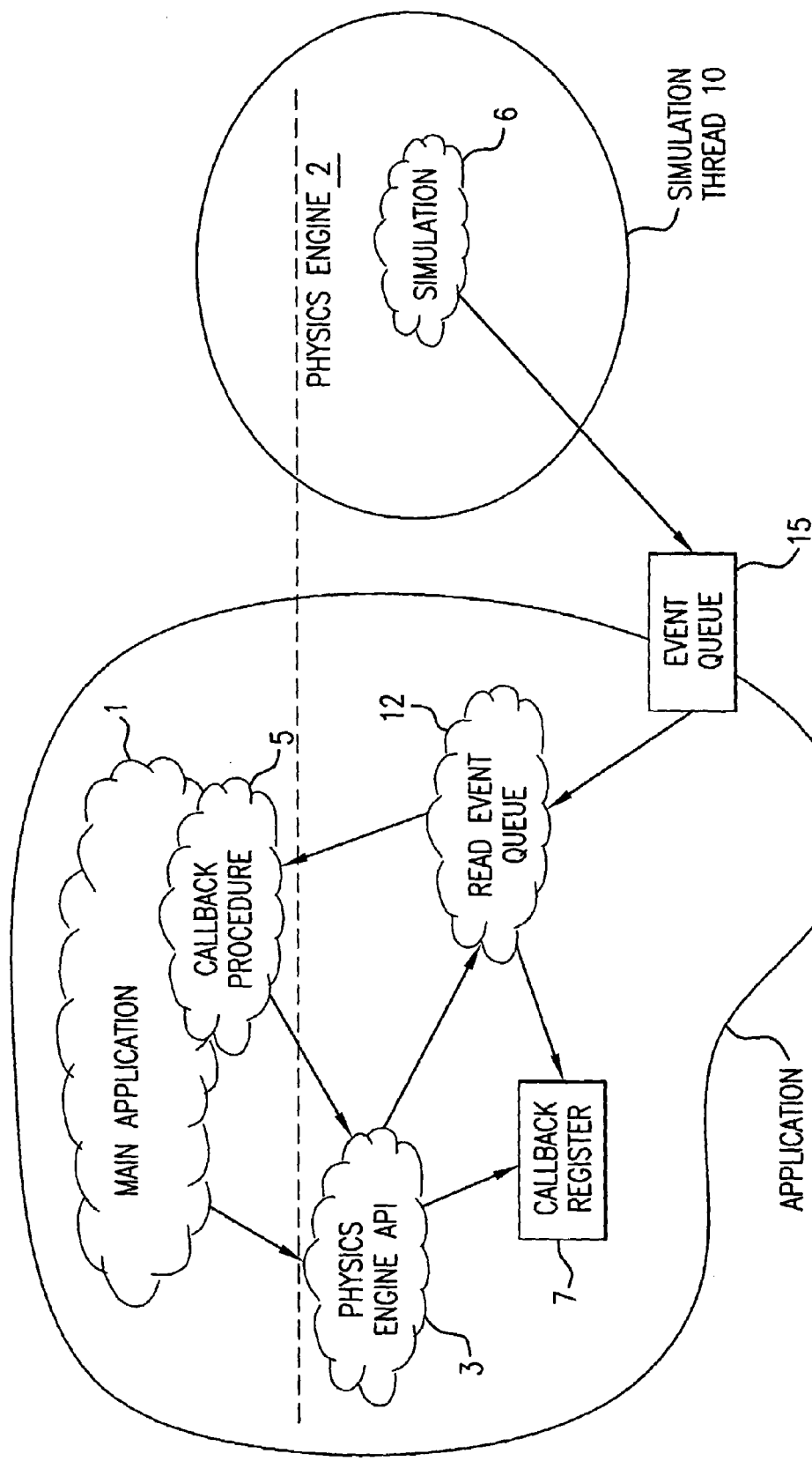
FIG. 3 is a conceptual diagram illustrating another embodiment of a callback mechanism consistent with the invention.

FIG. 3 illustrates another embodiment of the invention. This alternate embodiment avoids the potential problems associated with use of a shared memory, as between the main application and the one or more callback procedures. This embodiment is also characterized by the use of an event queue. Event queue 15 of FIG. 3 is shown in association with the second computational platform, but this need not be the case. Indeed, the event queue might be specifically associated with the first and/or second computational platform(s) or neither. Rather than immediately calling a corresponding callback procedure when requested physics data becomes available, physics engine 2 builds an event queue 15 to capture physics data potentially related to event(s) of interest.

As illustrated in FIG. 3, some embodiments of the invention may choose to execute only simulation 6 within a simulation thread 10 using one or more computational platforms. Execution of callback procedures are left to application thread 9 running, preferably but not necessarily, on a computational platform other than the one running simulation 6. As simulation 6 proceeds, it recognizes possible events of interest and places corresponding event data in event queue 15. "Event data" is any data related to an event and derived, at least in part, by a simulation. Event data will normally include physics data, but might be as simple as binary flag information.

Event queue 15 may take many hardware and/or software forms including, for example, a First-In, First-Out (FIFO) buffer, a stack register, or a scratch pad memory of some kind. Where the computational platform running the simulation thread is a PPU, for example, PCI or PCI Express messages may be used to communicate event data from the PPU to an event queue 15 located in the host system. Event data stored in event queue 15 is retrieved and processed by software 12 adapted to manage event queue and/or call a corresponding callback procedure 5. Event queue management software 12 will be designed in relation to the specific design and capabilities of callback register 7, physics engine API 3, event queue 15, and/or callback procedure 5. At a minimum, however, event queue management software 12 will call one or more callback procedures 5 in response to registered callbacks and available event data stored in event queue 15. Event queue management software 12 may run at defined intervals or upon being called by main application 1 through an appropriate command defined in physics engine API 3.

Until now, the exemplary embodiments have presupposed the use of specifically defined callback procedures to facilitate the request and transfer of event data from a simulation to a main application. The presence of such callback procedures within embodiments of the invention provides many benefits, including for example, the ready ability to pre-process event data before providing it to the main application. However, callback mechanisms within the context of embodiments of the invention do not necessarily require the use of defined callback procedures. The example shown in FIG. 4 is illustrative of this optional implementation feature.

Figure 4:
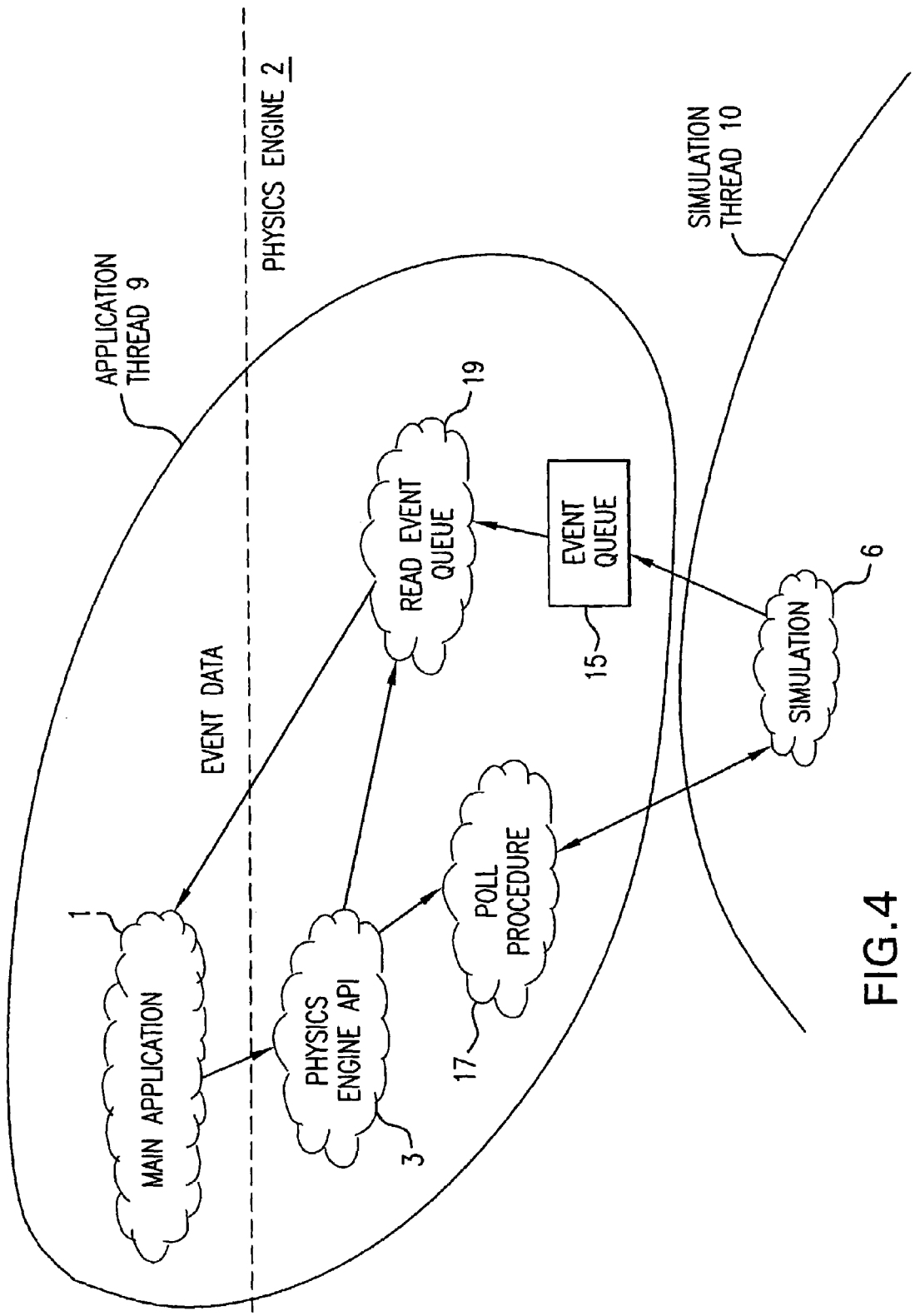
FIG. 4 is a conceptual diagram illustrating yet another embodiment of a callback mechanism consistent with the invention; and, FIG. 5 is a conceptual diagram illustrating still another embodiment of a callback mechanism consistent with the invention.

In FIG. 4, main application 1 communicates with physics engine 2 through physics engine API 3. Physics engine API 3 defines a polling procedure, whereby main application 1 may determine whether or not simulation 6 has finished an event determination procedure. The event determination procedure may be defined in any practical manner, for example in relation to a number of execution cycle or a time period in the simulation, or in relation to one or more events. However defined, completion of the event determination procedure is detectable via polling procedure 17. Thus, main application 1 may periodically call polling procedure 17 to determine whether or not the event determination procedure has been completed.

Where the event determination procedure is complete, main application 1 may call a read event queue procedure 19 which allows transfer of event data stored in event queue 15. In this embodiment, main application 1 is preferably able to consume the event data without additional pre-processing. In this manner, main application 1 may receive event data from event queue 15 on demand, so long as the event determination procedure indicates availability of requested event data. As with the exemplary embodiment of FIG. 3, the exemplary embodiment illustrated in FIG. 4 does not require the additional overhead and potential headaches associated with locking or synchronizing access to a shared memory.

Embodiments of the invention omitting the use of specific callback procedures, but rather, allowing direct consumption of event data by the main application are particularly well suited to situations where only a modest quantity of physics data is required by the main application, where the main application is highly computationally competent in and of itself, and/or where the computational platform running the application thread is very powerful in relation to the demands placed upon it by the main application.

The next exemplary embodiment described may in some ways be seen as occupying the opposite end of performance spectrum. That is, the exemplary embodiment illustrated in FIG. 5 is well suited to situations where specific callback procedures are designed to provide significant computational flexibility and capabilities, and/or where the main application places a significant burden on the resources available in the computational platform running the application thread and/or where the callback procedures benefits from being called with low latency (i.e., very little time elapses between when the simulation thread finishes computing physics data and when the callback procedure are called.

Figure 5:
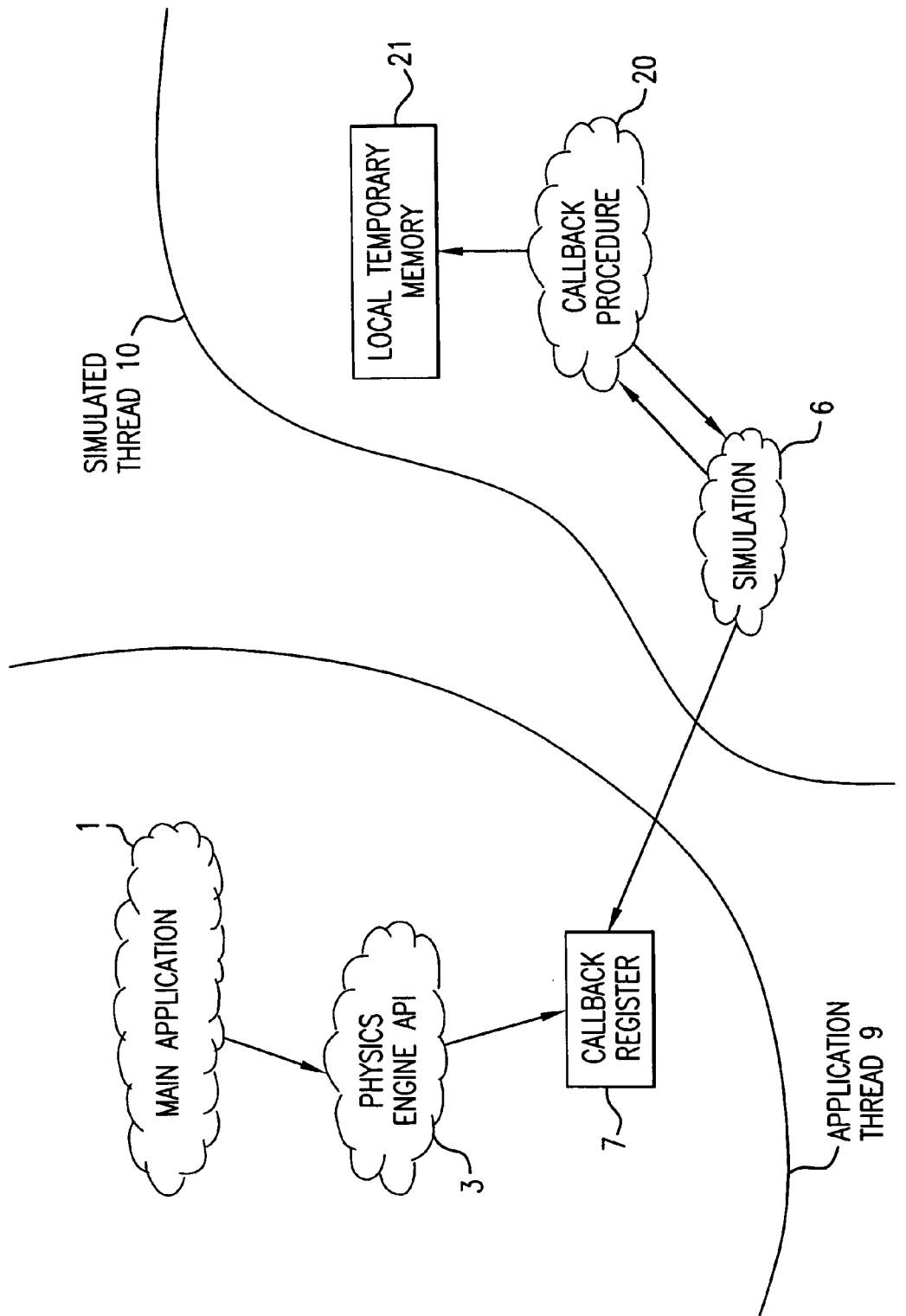

Like the exemplary embodiments described in relation to FIGS. 2 and 3, the exemplary embodiment illustrated in FIG. 5 registers one or more callbacks in relation to one or more events of interest. Physics engine API 3 may be used to register a callback using any one or of number of conventional techniques. However, as part of the callback registration procedure, main application 1 supplies the software actually implementing the callback procedure. When an event occurs that corresponds to a registered callback, the callback procedure is called, but the callback procedure is run in a restricted context in which it does not have access to memory accessible by main application 1. This type of callback procedure will be termed an "embedded callback" 20.

Embedded callback procedures are also restricted in the manner in which they are able to maintain state information from call to call. This restriction allows the physics engine to run an embedded callback procedure using computational platform resources that do not share memory with the computational platform running the application thread. For example, an embedded callback procedure is typically not allowed to use static or global variables to preserve state information from call to call, nor is it allowed, when called, to store arbitrary data in memory to be accessed during a subsequent call. Instead, a defined memory 21 which may be variously implemented using a specific memory, a shared general memory, a dedicated or general register, etc., will typically be used only to store temporary data during the time period in which the embedded callback procedure is running. These restrictions, however, allow the physics engine to run multiple copies of an embedded callback procedure in parallel on different processing resources using one or more execution threads. By enabling the physics engine to run multiple copies of an embedded callback procedure (potentially) in parallel, and on the same computational platform as simulation 6, this embodiment of the invention provides significantly better performance and higher scalability in physics simulations than embodiments characterized by calls to a callback procedure run on another computational platform in respond to the identification of an event of interest.

An embedded callback procedure may be provided by main application 1 either in source code or in object code form. If provided in source code form, it may be provided in assembler language, or a higher level language such as C, C++, or some dialect of the C programming language (e.g., C augmented with vector data types). If provided in object code form or in assembler language source code form, the embedded callback procedure may be expressed in terms of a native instruction set applicable to the computational platform running the simulation, or in terms of a virtual machine instruction set, such as those commonly known in the art. Use of a virtual machine instruction set representation or a higher level language representation provides some level of abstraction in relation to the actual hardware resources forming the computational platform. This allows different types of hardware to be used with the same callback procedure. Application developers need only provide one version of the callback procedure and at run-time a physics engine can automatically translate (e.g., compile) the procedure into a native format appropriate to the computational platform hardware. Alternatively, the physics engine may use a virtual machine interpreter or high level language interpreter, like those commonly known in the art, to interpret the representation of the callback procedure as it is being executed, as opposed to translating or compiling it.

What is claimed is:

1. A method of implementing a callback procedure in a system, comprising:
    executing an application thread related to a main application;
    executing a simulation thread in parallel with the application thread;
    by operation of the application thread,
        registering a callback procedure in a callback register, wherein the
        callback procedure comprises source code or object code; and
    by operation of the simulation thread,
        identifying the occurrence of an event based on event data produced by the simulation thread,
        reading the callback procedure from the callback register in response to the occurrence of the event, and
        executing the callback procedure.

2. The method of claim 1, wherein the system comprises first and second computational platforms and a shared memory accessible by the first and second computational platforms and the method further comprises:
    executing the application thread on the first computational platform;
    executing the simulation thread on the second computational platform; and,
    executing the callback procedure on either the first or second computational platform.

3. The method of claim 2, wherein registering the callback procedure comprises writing source code or object code to the callback register.

4. The method of claim 3, wherein executing the callback procedure comprises generating callback results and writing the callback results to the shared memory.

5. The method of claim 2, wherein the application thread registers the callback procedure through an Application Programming Interface (API) associated with at least one of the first and second computational platforms.

6. The method of claim 5, wherein the first computational platform comprises a first processor and the second computational platform comprises a second processor.

7. The method of claim 6, wherein the first processor comprises a Central Processing Unit (CPU) resident in a host system and the second processor comprises a Physics Processing Unit (PPU).

8. The method of claim 7, wherein the PPU comprises a PCI, PCI Express or Hyperchannel connected printed circuit board.

9. The method of claim 6, wherein the first processor comprises one core of a multi-core processor and the second processor comprises another core of the multi-core processor.

10. The method of claim 1, wherein the callback procedure is related to collision or contact editing, procedural force calculation, custom constraint calculation, a dynamic material property, a sleep/wake mode, a custom shape intersection, or a custom Axis Aligned Bounding Box (AABB) calculation.

11. The method of claim 1, wherein the system comprises first and second computational platforms, and the method further comprises:
executing the application thread on the first computational platform;
executing the simulation thread on the second computational platform; and,
executing the callback procedure.

12. The method of claim 11, wherein the callback register is associated with the second computational platform, and registering the callback procedure comprises writing source code or object code to the callback register using an Application Programming Interface (API) associated with at least one of the first and second computational platform.

13. The method of claim 12, wherein the system further comprises an event queue and executing the simulation thread comprises writing the event data to the event queue.

14. The method of claim 13, further comprising:
transferring the event data from the event queue to a memory accessible by the first computational platform.

15. The method of claim 14, wherein the API defines a call to an event queue management procedure adapted to transfer event data from the event queue to the memory.

16. The method of claim 14, wherein the callback procedure is executed using physics data that comprises a portion of the event data produced by the simulation thread.

17. The method of claim 11, wherein the callback procedure is related to collision/contact editing, procedural force calculation, custom constraint calculation, a dynamic material property, a sleep/wake mode, a custom shape intersection, or a custom Axis Aligned Bounding Box (AABB) calculation.

18. The method of claim 1, wherein the callback procedure comprises object code written in terms of a native instruction set or a virtual machine instruction set associated with the computational platform on which the callback procedure is run.

19. The method of claim 1, wherein the data derived from the simulation thread comprises physics data, the callback procedure is executed in parallel with one or more additional callback procedures, and the callback procedure and the one or more additional callback procedures are executed with the physics data to generate callback results.

20. The method of claim 19, wherein the callback procedure facilitates the transfer and storage of the physics data to a memory location accessible by the application thread.

21. A method of executing a callback procedure in a system, the method comprising:
executing an application thread on a first computational platform;
executing a simulation thread on a second computational platform;
during execution of the application thread,
registering a callback procedure in a callback register associated with the second computational platform by transferring data comprising source code or object code related to the callback procedure from the first computational platform to the callback register associated with the second computational platform, and
during execution of the simulation thread,
identifying the occurrence of an event based on event data produced by the simulation thread,
reading the callback procedure from the callback register in response to the occurrence of the event, and
executing the call back procedure.

22. The method of claim 21,
wherein executing the callback procedure comprises running the source code or object code using a local temporary memory or register associated with the second computational platform to derive callback data.

23. The method of claim 21, further comprising:
transferring the callback data from the second computational platform to the first computational platform for consumption by the application thread.

24. The method of claim 23, wherein the callback procedure comprises source code written in assembly language or a higher level language.

25. The method of claim 23, wherein the callback procedure comprises object code written in terms of a native instruction set or a virtual machine instruction set related to the second computational platform.

26. The method of claim 21, wherein the callback procedure is executed using physics data that comprises a portion of the event data produced by the simulation thread.

27. A system comprising:
a first computational platform executing an application thread and a second computational platform executing a simulation thread in parallel with the application thread;
a callback mechanism adapted to register a callback procedure in a callback register in response to the application thread and to execute the callback procedure in response to the occurrence of an event identified based on event data derived from the simulation thread, wherein the callback procedure comprises source code or object code.

28. The system of claim 27, wherein the
callback register is associated with the second computational platform and stores data indicative of the callback procedure.

29. The system of claim 28, further comprising memory accessible by the first computational platform storing an Application Programming Interface (API).

30. The system of claim 29, further comprising shared memory accessible by the first computational platform in response to the application thread, and accessible by either the first or second computational platforms response to the simulation thread.

31. The system of claim 27, further comprising an event queue receiving the event data derived from the simulation thread, wherein the event data comprises data related to one or more events; and
wherein the callback procedure is executed when an event occurs that corresponds to the callback procedure.

32. The system of claim 28, wherein the system further comprises a local temporary memory or register associated with the second computational platform and storing temporary data associated with execution of the callback procedure on the second computational platform.

33. The system of claim 32, wherein the callback procedure is passed from the first computational platform to the second computational platform.

34. The method of claim 27, wherein the callback procedure is executed using physics data that comprises a portion of the event data produced by the simulation thread.

35. A system comprising:
a Central Processing Unit (CPU) running a main application;
a physics engine running a simulation in parallel with the main application;
a callback mechanism adapted to enable the main application to register a callback procedure in a callback register associated with the physics engine, wherein the main application registers the callback procedure in response to the occurrence of an event identified based on event data derived from the simulation, the callback procedure comprises source code or object code, and the callback procedure is executed by running the source code or object code.

36. The system of claim 35, wherein the physics engine comprises a processor.

37. The system of claim 35, wherein the physics engine comprises a Physics Processing Unit (PPU).

38. The system of claim 35, wherein the CPU comprises a first processor core in a multi-core processor and the physics engine comprises a second processor core in the multi-core processor.

39. The method of claim 35, wherein the callback procedure is executed using physics data that comprises a portion of the event data produced by the simulation thread.

* * * * *